United States Patent
Tabara

[19]

[11] Patent Number: 6,114,182
[45] Date of Patent: Sep. 5, 2000

[54] MEASUREMENT OF ELECTRON SHADING DAMAGE

[75] Inventor: Suguru Tabara, Hamamatsu, Japan

[73] Assignee: Yamaha Corporation, Tokyo, Japan

[21] Appl. No.: 09/271,104

[22] Filed: Mar. 18, 1999

[30] Foreign Application Priority Data

Mar. 18, 1998 [JP] Japan ................................. 10-068608

[51] Int. Cl.[7] .................................................. H01L 21/66
[52] U.S. Cl. ............................ 438/17; 438/250; 438/591
[58] Field of Search ................................. 438/10, 11, 17, 438/18, 250, 287, 393, 591

[56] References Cited

U.S. PATENT DOCUMENTS

| 3,893,152 | 7/1975 | Lin ......................................... | 438/287 |
| 4,151,537 | 4/1979 | Goldman et al. ....................... | 438/591 |
| 4,840,917 | 6/1989 | Sheu ...................................... | 438/591 |

FOREIGN PATENT DOCUMENTS

| 1084022 | 3/1998 | Japan . |
| 1084023 | 3/1998 | Japan . |

OTHER PUBLICATIONS

Concise Explanation of Relevent Portions of References—2 pages.
Suguru Tabara, *A New Etching Method for Reducing the Electron Shading Damage Using ICP Etcher*, May 13–14, 1996, pp. 51–53.
Koichi Hashimoto, *New Phenemona of Charge Damage in Plasma Etching: Heavy Damage Only through Dense–Line Antenna*, Dec. 1993, pp. 6109–6113.
Koichi Hashimoto, *Charge Damage Caused by Electron Shading Effect*, Oct. 1994, pp. 6013–6018.

*Primary Examiner*—Chandra Chaudhari
*Attorney, Agent, or Firm*—Ostrolenk, Faber, Gerb Soffen, LLP

[57] ABSTRACT

A resist pattern having a high-density pattern area and a low-density pattern area is formed on a layered MNOS capacitor structure composed of a Ti(O)N layer and a $WSi_2$ layer formed on nitride/oxide insulating layer on a semiconductor substrate. After the etching of the layered structure in the low-density resist pattern area is finished, the layered structure is further processed with plasma of HBr only, a mixed gas of a halogen-containing gas and oxygen gas, or a fluorine-containing gas, for a desired period of time, to give electron shading damage. In this plasma processing, the Ti(O)N layer is etched little. The electron shading damage is measured through the change in the flat band voltage of the MNOS capacitor.

12 Claims, 6 Drawing Sheets

MEASUREMENT OF ELECTRON SHADING DAMAGE

This application is based on Japanese Patent Application BEI 10(1998)-68608, filed on Mar. 18, 1998, the entire contents of which are incorporated herein by reference.

BACKGROUND OF THE INVENTION a). Field of the Invention

The present invention relates to inspection of semiconductor fabrication, in particular, to measurement of electron shading damage in plasma-assisted semiconductor fabrication.

In this specification, the terminology "electron shading damage" is used to mean the damage in semiconductor device caused by excess positive charge flown into a conductive surface due to shading of electrons.

b). Description of the Related Art

The tendency in the art of semiconductor integrated circuit devices is to achieve higher integration (smaller dimensions), and larger diameter of the semiconductor wafer. In that situation, low-pressure, high-density plasma is indispensable to micro-patterning of semiconductor devices. In such plasma-assisted semiconductor patterning, the plasma to be used is so designed that the positive charges and the negative charges are well balanced therein so as to protect the semiconductor substrates from being adversely influenced by the charges injected thereinto from the plasma.

However, in plasma-assisted processing of a layer covered with a resist (or insulating film) mask with apertures having a high aspect ratio, there occurs charging damage of so-called electron shading damage that is peculiar to high-density plasma-assisted process, even though plasma having uniform charge distribution is used.

It is believed that the electron shading damage is caused by the difference in behavior between electrons and ions. Suppose a case where a conductive layer to be etched is electrically isolated from a semiconductor substrate while opposing to the substrate via a thin insulating film such as a gate oxide film or the like.

In general, the semiconductor substrate and the plasma shall have a bias potential (electric field) therebetween, and the positively-charged ions among the plasma enter the substrate while being accelerated. Whereas, the negatively-charged electrons are decelerated in the electric field. As a result, the ions are incident to the substrate nearly vertically thereto, while the electrons are obliquely incident to the substrate since the velocity components in the directions parallel to the surface of the substrate become relatively large.

Where the conductive layer to be etched has an insulator pattern thereon that surrounds a conductive surface, the electrons proceeding to the conductive surface in oblique directions are shaded by the insulator pattern. Ions of normal incidence are not shaded by the insulator pattern and can be injected to the layer in the direction vertical to the surface of the layer. This results in an overflow of positive charges into the conductive surface.

The electrons having been thus captured on the side walls of the insulator pattern form an electric field which repulses the incoming electrons. The electrons having small kinetic energy in the vertical direction are substantially repulsed by the electric field. In contrast to this, however, the positively-charged ions are not repulsed but accelerated by the electric field formed by the captured electrons, and enter the conductive surface below the insulator pattern. This further augments the overflow of positive charges in the conductive surface. It is believed that the electron shading damage occurs in this way.

Positive charges shall accumulate in the conductive layer below the insulator pattern. Where the conductive layer is connected with an insulated gate electrode, an electric field will be imparted across the gate-insulating film by the accumulated positive charges. When a tunneling current passes through the gate-insulating film due to this electric field, the positive charges stored in the conductive layer will reach a stationary state. However, the gate-insulating film is degraded by the tunneling current.

When the gate-insulating film is thick, the tunneling current hardly passes through the gate-insulating film and the positive charges stored in the conductive layer increase. Then, the thus-accumulated positive charges will generate an electric field in which electrons are attracted to the surface of the conductive layer. When electrons are attracted to the surface of the conductive layer by this electric field, the charge stored in the conductive layer will reach a stationary state even when no tunneling current passes through the gate-insulating film.

In MOS transistors of smaller dimensions, the thickness of gate oxide films becomes smaller. For such thinner gate-insulating films, the tunneling current passes more easily. Thereby the life of the gate-insulating films becomes short by the tunneling current caused by electron shading.

In low-pressure, high-density plasma-process of a semiconductor substrate, measurement of the degree of electron shading damage (the charging damage caused by electron shading) is indispensable for improving the reliability of the semiconductor devices to be fabricated.

For the measurement of electron shading damage, for example, is known a method of connecting a comb-shaped antenna to the gate electrode of a MOS transistor followed by subjecting the comb-shaped antenna to plasma treatment to measure the threshold voltage shift in the MOS transistor induced by the plasma treatment.

When a tunneling current passes through the gate oxide film by the electron shading damage, the threshold voltage of the MOS transistor is shifted. Measuring the shifted threshold voltage makes it possible to calculate the amount of charges having passed through the gate oxide film.

This method requires preparing MOS transistors for electron shading damage measurement. For establishing a process, it is required to optimize various process parameters. In such a situation, preparing MOS transistor samples only for monitoring the process condition brings about increase in production costs.

For more simple samples for measurement, another method of using samples of simpler structure utilizes a MOS capacitor (with a gate electrode only) but not a MOS transistor structure. According to this method of using a MOS capacitor as a sample for measurement, however, the threshold voltage cannot be measured. In this method, therefore, the breakdown voltage of the insulating film in the MOS capacitor is measured. However, the accuracy in the breakdown voltage measurement in the MOS capacitor is low, and it is therefore difficult to quantify the degree of charging damage according to this method.

As described above, the process monitoring using test elements of MOS transistor enables the quantitative measurement of the degree of electron shading damage, but the cost for sample preparation is high. On the other hand, if aMOS capacitor is inspected as the test device, the cost for sample preparation can be reduced, but the measurement accuracy is low.

In general, a conductive layer as formed on the entire surface of a semiconductor substrate is electrically connected with the semiconductor substrate anywhere (for example, in the scribe lines). In this condition, any positive charges entering the conductive layer cause no problem so far as they directly flow away into the semiconductor substrate.

After the main etching of the conductive layer to be etched (to give an interconnection pattern) in an open space on a semiconductor substrate has finished, the remaining, non-etched interconnection pattern is electrically isolated from the semiconductor substrate. Then, over-etching should be done to etch residual conductive layer in narrow spaces. In this condition, electron shading damage is caused by the charges that enter the layer to be further etched owing to the micro-loading effect, and flow through the gate oxide film.

Therefore, the electron shading damage depends on the time from the finish of the main etching in the open space to the finish of the over-etching in the narrow space. In other words, measurement of the electron shading damage depends on the time for the over-etching of the layer to be etched, and therefore, if the over-etching time is short, the electron shading damage is difficult to be measured with accuracy.

For detailed studies of electron shading damage caused by plasma to be measured, it is desired to measure the electron shading damage for a desired, satisfactorily long period of time.

SUMMARY OF THE INVENTION

One object of the invention is to provide a method for measuring electron shading damage in semiconductor fabrication, for which sample production cost is low and which gives accurate data.

Another object of the invention is to provide a method for measuring electron shading damage in which electron shading damage can be measured for a desired long period of time.

According to one aspect of the invention, there is provided a method for measuring electron shading damage in semiconductor fabrication, which comprising: a step of forcedly flowing a current through a first capacitor structure including a lamination of conductive layer/nitride film/oxide film formed on a semiconductor substrate, and preparing characteristic curve indicating change in flat band voltage relative to amount of injected charge; a step of preparing a second capacitor structure including a lamination of conductive layer/nitride film/oxide film formed on a semiconductor substrate; a step of forming an insulating layer on the semiconductor substrate, the insulating layer having an aperture on the second capacitor structure, forming thereon a conductive antenna layer that comprises a lower layer of TiN or TiON and an upper layer of a conductor and is connected with the conductive layer via the aperture, and further forming thereon an insulating mask pattern including a low-density pattern region and a high-density pattern region to thereby prepare a sample; a first etching step of dry-etching the conductive antenna layer with first plasma to completely remove the antenna layer in the low-density pattern region; a step, following the first etching step, for plasma-processing the substrate with plasma of any of a mixed gas of a halogen-containing gas and oxygen, HBr, and a fluorine-containing gas; a second etching step of wet-etching at least the lower layer of TiN or TiON of the conductive antenna layer that remains in the high-density pattern region; a step of measuring the flat band voltage of the second capacitor structure before and after the plasma-processing step to thereby determine a change thereof; and a step of calculating amount of charges having been injected into the second capacitor structure through the plasma-processing, from the change of the flat band voltage, based on said characteristic curve.

The expression "x/y" for a lamination indicates a laminate structure including an "x" layer formed on "y" layer.

Preparing the stacked (MNOS) capacitor structure of conductive layer/nitride layer/oxide layer/semiconductor substrate enables a flat band voltage to sensitively vary, depending on the amount of the charges injected thereinto. The amount of the charge injected into the capacitor structure can be estimated by measuring change in the flat band voltage.

The plasma of HBr, an oxygen-containing gas or a fluorine-containing gas used here for the intended measurement does not substantially etch TiN or TiON. Therefore, the plasma processing with any of those gases can be effected for a desired period of time. Irrespective of the plasma-generating condition, plasma processing can be performed for a desired period of time. Therefore, the comparison and analysis of the obtained data become easy.

Accordingly, accurate measurement of electron shading damage can be done by performing plasma processing for a desired period of time. The properties of the plasma employed therein can be measured accurately, and the process of semiconductor fabrication can be optimized rapidly in a simplified manner.

DESCRIPTION OF THE PREFERRED EMBODIMENTS

Among the constituent elements of a semiconductor integrated circuit device, one that is most influenced by electron shading damage is, in general, the gate oxide film in a MOS transistor. Where the upper interconnection is connected with the gate electrode, the charges having been injected into the upper interconnection pattern, which is being etched, concentrate in the gate electrode and cause a tunneling current to flow through the gate oxide film.

The life of the gate oxide film is substantially limited by the accumulated value of the tunneling current having passed through the film. Therefore, it is important to determine the accumulated value of the tunneling current having passed through the gate oxide film in the process of semiconductor fabrication.

Figure 1A:
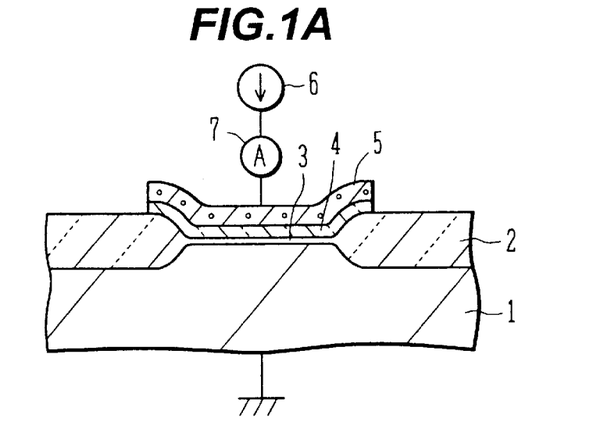
FIG. 1A is a cross-sectional view of a sample used for the measurement according to an embodiment of the invention.
Figure 1B:
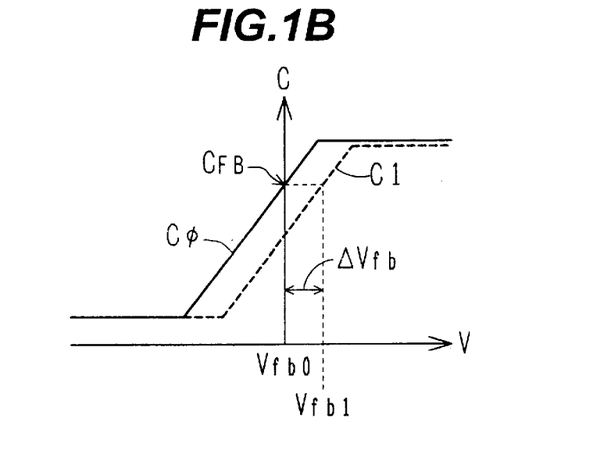
FIG. 1B and FIG. 1C are graphs of the data obtained in the measurement.
Figure 1C:
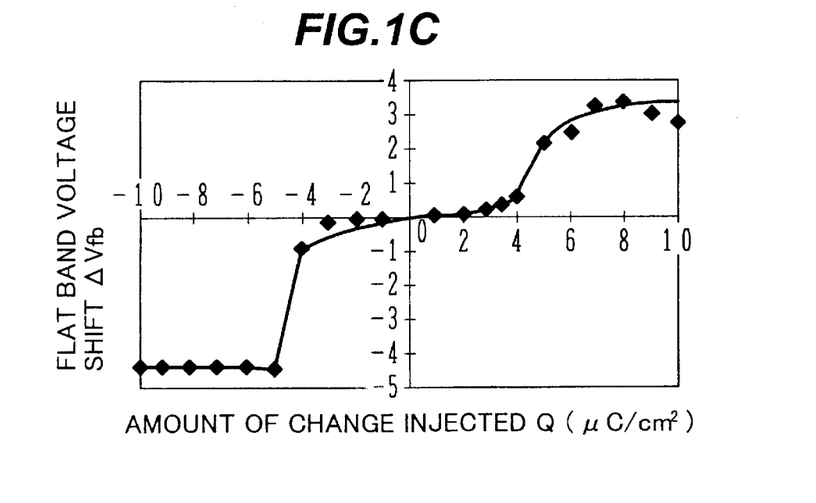

FIG. 1A, FIG. 1B and FIG. 1C illustrate the preliminary test to be carried out prior to process monitoring. FIG. 1A shows the sample for the preliminary test and a step of applying current stress to the sample. FIG. 1B is a graph schematically showing the result of C-V measurement of the sample before and after the stress application. FIG. 1C is a graph showing the variation in the flat band voltage, Vfb, relative to the amount of the charges, Q, injected in the preliminary test.

As shown in FIG. 1A, a field oxide film 2 with apertures in the active region, having a thickness of, for example, about 400 nm, is formed on the surface of an n-type Si substrate 1 through local oxidation of silicon (LOCOS). An oxide film 3 having a thickness of, for example, about 2 nm is formed in the aperture of the field oxide film 2, through thermal oxidation, and a nitride film 4 having a thickness of, for example, about 100 nm is grown thereon through CVD. The area of the onide film 3 is, for example, about 500 $\mu m \times 500~\mu m$.

An electrode 5 of polycrystalline Si is grown on the nitride film 4 through CVD. The electrode 5 corresponds to an insulated gate electrode, and may have a thickness of, for example, several hundreds nm or so. However, its thickness is not critical, so far as the electrode can have a low resistance. In place of the polycrystalline Si electrode, a polycide electrode composed of a lower layer of polycrystalline Si and an upper layer of silicide may be employed. A metal electrode may also be employed The layered structure of the electrode 5 and the nitride film 4 is patterned to prepare a sample for measurement. It is desirable that the sample is annealed prior to the measurement, to remove the influences of the process performed thereon.

First, the capacitance of the sample of FIG. 1A is measured as a function of the voltage applied to the sample, from which is obtained the C-V characteristic of the sample. For the C-V measurement, for example, the frequency may be 1 MHz, and the voltage may be between −5V and +5V. When the nitride film 4 is thin, the voltage range may be narrowed.

The gate voltage, Vg, at which the capacitance of the MNOS capacitor under measurement becomes the flat band capacitance, $C_{FB}$, of a MIS (metal-insulator-semiconductor) capacitor, which is represented by the following equation (1), is defined as a flat band voltage, Vfb.

$$C_{FB} = \epsilon i / \{d + (\epsilon i / \epsilon s)(kT\epsilon s/ni/q^2)^{1/2}\} \quad (1)$$

wherein d indicates the thickness of the insulating film; $\epsilon i$ indicates the dielectric constant of the insulating film; $\epsilon s$ indicates the dielectric constant of the semiconductor substrate; and ni indicates the intrinsic carrier density. The initial flat band voltage is designated by Vfb0.

The n-type Si substrate 1 is grounded (earthed), and the Si electrode 5 is used as a positive electrode. A current is injected into the sample from a constant current source 6. The constant current source 6 is connected with an ammeter 7, by which the current being applied to the sample is monitored. The ammeter 7 may comprise, for example, a reference resistor and a voltmeter for measuring the voltage drop across the reference resistor. Another sample of the same type as above, in which, however, the electrode 5 is used as a negative electrode, is prepared. To this sample, current stress with reversed polarity is applied.

A current is applied to the MNOS capacitor comprising the Si electrode 5, the nitride film 4, the oxide film 3 and the n-type Si substrate 1, using the constant current source 6. A tunneling current passes through the nitride film 4 and the oxide film 3, and the oxide film 3 is damaged by the tunneling current. The damage by the tunneling current can be estimated from the amount of the charge having been applied to the oxide film 3, that is to say, the accumulated value of the current having passed through the ammeter 7. After the current stress application, the sample is again subjected to the C-V characteristic measurement.

FIG. 1B is a graph schematically showing the result of the C-V measurement. The C-V characteristic before stress application is represented by the curve C$\phi$; and that after stress application is represented by the curve Cl. The flat band voltage of the C-V characteristic after stress application is represented by Vfb1. Specifically, the flat band voltage change by the current stress application, $\Delta$Vfb, is represented as $\Delta$Vfb=Vfb1−Vfb0. The flat band voltage change, $\Delta$Vfb, is obtained as a function of the amount of the charge having been applied to the sample from the constant current source 6.

FIG. 1C shows the flat band voltage shift, $\Delta$Vfb, as a function of the amount of the charge, Q, injected into the sample, in which the ordinate indicates the amount of the charge injected, Q($\mu C/cm^2$), and the abscissa indicates the flat band voltage shift, $\Delta$Vfb (V). In the MNOS capacitor used for the measurement, the electrode area is 250,000 $\mu m^2$, the thickness of the nitride film is 100 nm and the thickness of the oxide film is 2 nm, as mentioned above.

After the flat band voltage shift, $\Delta$Vfb, is once obtained as a function of the amount of the charge injected, Q, as in FIG. 1C, other samples having the same constitution as above may be subjected to a process, which is the object of measurement, to measure the flat band voltage shift. The amount of the charge having passed through the oxide film in each sample during the process can be known from the flat band voltage shift.

FIG. 2A to FIG. 2C and FIG. 3A to FIG. 3C show the structure of a process monitor sample.

Figure 2A:
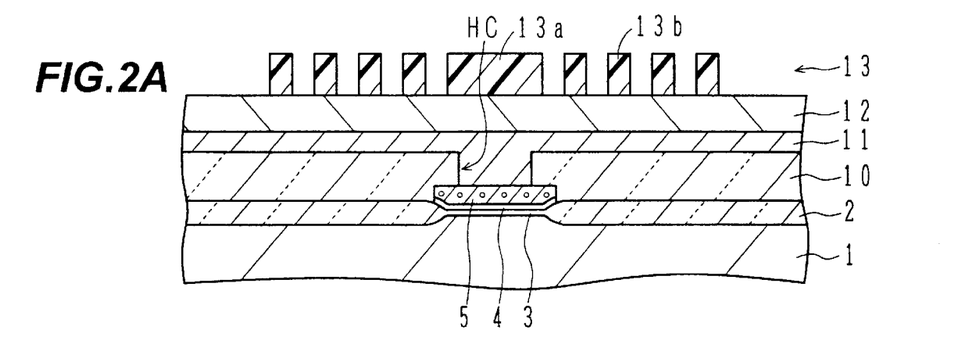
FIG. 2A to FIG. 2C are cross-sectional views and a plan view of a process monitor sample for the measurement according to the one embodiment of the invention.

As shown in FIG. 2A, a field oxide film 2, an oxide film 3, a nitride film 4 and an electrode 5 are formed on an n-type Si substrate 1. This constitution is the same as in the sample for current stress measurement shown in FIG. 1A. After the MNOS capacitor structure illustrated is formed, it is annealed at 400° C. for 30 minutes in a mixed atmosphere of $O_2$ and $N_2$, to thereby remove the influence of the step of etching the electrode 5. After this, the sample is subjected to measurement for the initial C-V characteristic. The flat band voltage of the sample thus obtained is referred to as the initial flat band voltage thereof.

An insulating film 10 having a thickness of, for example, 500 nm is formed on the surface of the MNOS capacitor structure, through CVD or the like. The insulating film 10 may be an oxide film of, for example, borophosphosilicate glass (BPSG), a nitride film or the like. Aphotoresist mask with an aperture is formed on the MNOS capacitor structure, and the insulating film 10 exposed in the aperture is selectively removed to form a hole, HC, for connection.

After the hole, HC, is formed through the insulating film 10, the structure is annealed, for example, in a mixed atmosphere of $O_2$ and $N_2$ at about 400° C. for 30 minutes so as to remove the influence of the step of etching the aperture. In case the flat band voltage of the MNOS capacitor is shifted by the etching for forming the MNOS capacitor structure and/or by the etching for forming the aperture in the insulating film 10, the shift is removed by the annealing. The initial flat band voltage of the MNOS capacitor may be measured at this stage through the C-V measurement.

In the following, mixture of A and B may be designated as "A/B".

If the etching for forming of the MNOS capacitor structure and the etching for forming the aperture in the insulating film 10 are carried out by a method accompanying no charging damage, for example, with wet etching method, the annealing step may be dispensed with.

Next, an antenna layer including a lower layer 11 of TiN or TiON and an upper layer 12 of a conductor such as $WSi_2$ or the like is deposited on the surface of the Si substrate 1. The antenna layer is connected with the upper electrode 5 of the MNOS capacitor, through the aperture in the insulating film 10.

Although description is made on the cases where the initial flat band voltage is measured after patterning the electrode 5 and the nitride film 4 and/or after forming the aperture in the insulating film 10, the initial flat band voltage may also be measured after depositing and annealing the antenna layer. The measurement of the initial flat band voltage may be performed in a variety of ways, provided that the measurement gives the flat band voltage of the MNOS capacitor structure under the condition where the structure is not influenced by the process to be measured.

In this connection, it is to be noted that, since the measured value for the flat band voltage of the structure after the antenna layer is deposited shall include not only the capacitance of the MNOS capacitor structure itself but also the capacitance of the antenna layer having a broad area that extends around its periphery, the accuracy of the data will be lowered to some degree for calculating the final flat band voltage change in the structure.

After the antenna layer 11 and 12 is deposited, a resist mask pattern 13 is formed on its surface through photolithography.

Figure 2B:
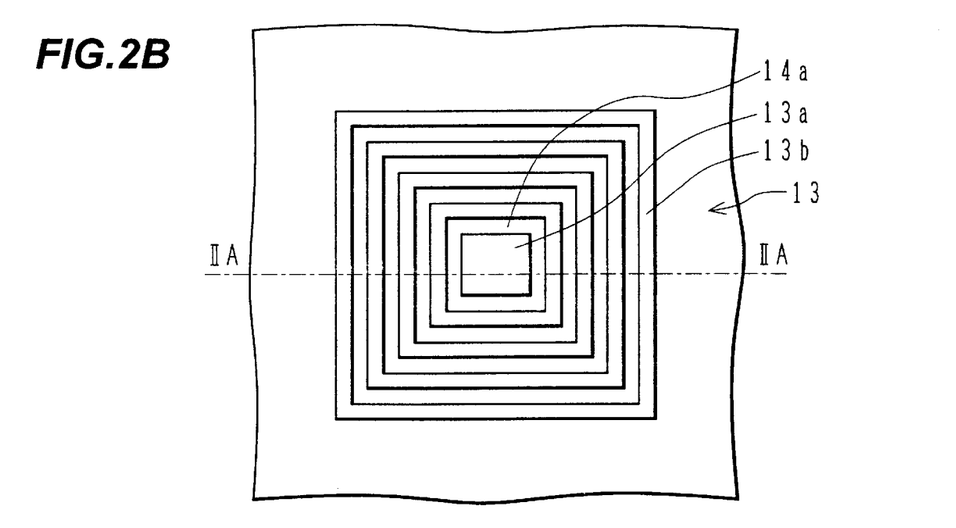

FIG. 2B is a plan view schematically showing the resist mask pattern 13. On the MNOS capacitor structure, is disposed an isolated pattern 13a having nearly the same plan profile as the electrode 5 or having a profile falling within the area of the electrode 5, and a plurality of loop patterns 13b surround the pattern 13a in a multi-loop configuration, via a plurality of narrow loop gaps therebetween.

The isolated pattern 13a is isolated from the adjacent loop pattern 13b via a closed loop gap 14a intervening therebetween. The constitution of the loop patterns 13b is, for example, such that the patterns each having a width of about 1 $\mu$m are disposed via gaps of about 1 $\mu$m wide between each pair of adjacent loops. For example, by controlling the thickness of the resist mask pattern 13, the aspect ratio of the aperture 14a of the resist mask pattern 13 can be variously changed.

The loop patterns form a high-density pattern region, and the open space around the loop patterns forms a low-density pattern region. A sparse or coarse pattern having wide apertures may be formed at the both sides of the low-density pattern region. The sample thus prepared for measurement is subjected to a treatment including a dry-process to be inspected.

Figure 4:
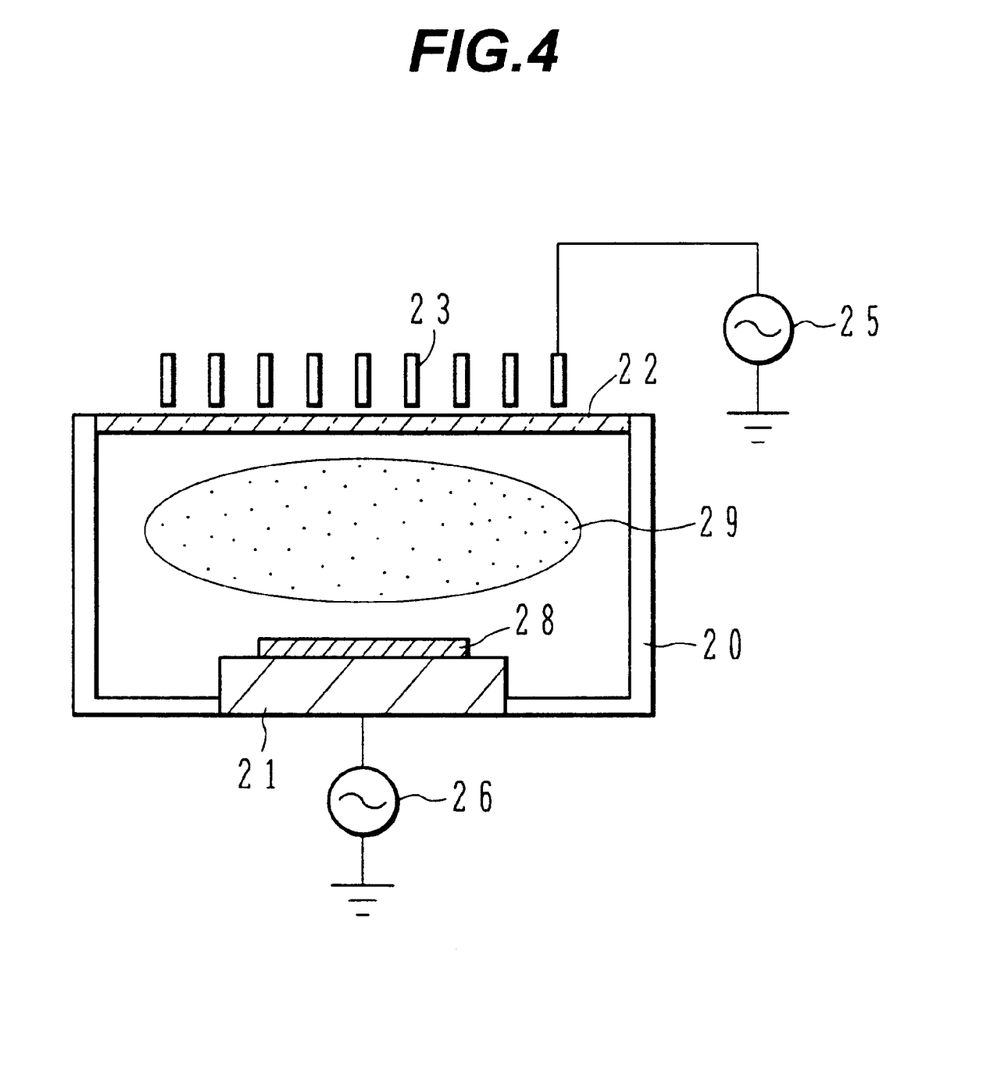
FIG. 4 is a cross-sectional view schematically showing the structure of a plasma etching device used in the embodiment of the invention.

FIG. 4 is a view schematically showing the structure of an inductively coupled plasma etching system, which is one typical example of the apparatus for performing the dry-process to be inspected. In FIG. 4, a bottom electrode 21 is disposed at the bottom of a vacuum chamber 20. Above the vacuum chamber 20, is disposed a dielectric window 22, and an induction coil 23 is disposed thereon. The induction coil 23 is connected with a high-frequency power source 25 of, for example, 13.56 MHz. The bottom electrode 21 is also connected with a high-frequency power source 26 of, for example, 13.56 MHz.

A sample 28 for measurement having a structure as shown in FIG. 2A and FIG. 2B is set on the bottom electrode 21, and a working gas is introduced into the vacuum chamber 20. High-frequency power is supplied from the power sources 25, 26, to generate plasma 29 in the vacuum chamber 20. By the plasma 29, the antenna layer 11 and 12 exposed in the apertures of the resist mask pattern 13 is etched.

In case where the antenna layer 11 and 12 is kept in contact with the surface of the substrate anywhere, charge, even though injected into the antenna layer 11 and 12, can escape to the substrate.

When the width of the aperture in the resist mask pattern 13 is narrow, and the aspect ratio of the aperture is high to a certain degree, electron shading effect occurs.

The electron shading effect causes micro-loading effect in etching. Owing to the micro-loading effect, etching rate in the high-density pattern region becomes lower than that in the low-density pattern region.

Herein under, description will be made on the case where the upper layer 12 of the conductor is formed of $WSi_2$ and the lower layer 11 of the conductor is formed of TiN or TiON (to be collectively referred to as Ti(O)N).

First, the $WSi_2$ layer 12 is selectively etched with plasma of gas of $Cl_2$, $Cl_2/O_2$ ($Cl_2$ and $O_2$), $SF_6/HBr$ ($SF_6$ and HBr) or the like, using the resist pattern 13 as a mask.

Figure 2C:
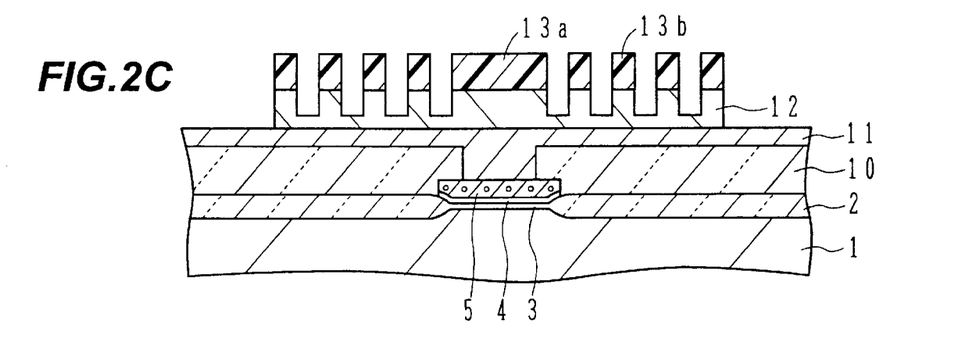

FIG. 2C shows the state when the $WSi_2$ layer 12 in the open space of the low-density pattern region is just etched. At this stage, the etching of the $WSi_2$ layer 12 in the high-density pattern region has not finished due to the micro-loading effect, and part of the $WSi_2$ layer 12 still remains.

Figure 3A:
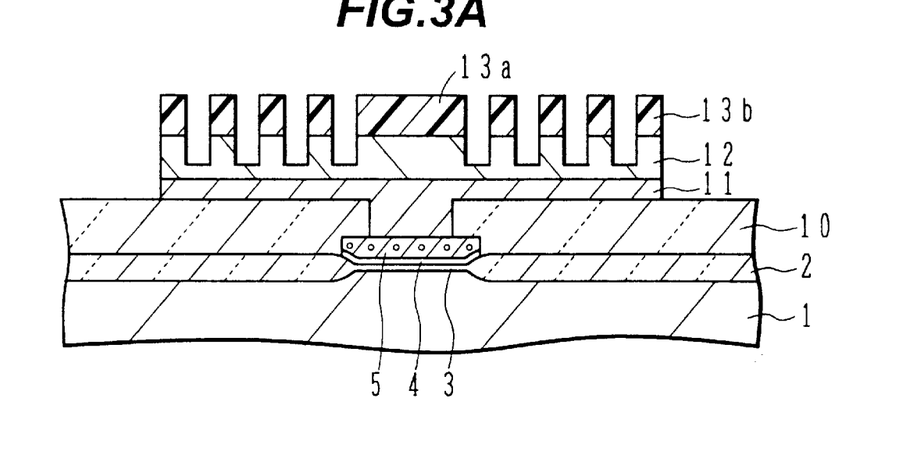
FIG. 3A to FIG. 3C are cross-sectional views of a process monitor sample for the measurement according to the one embodiment of the invention.

As shown in FIG. 3A, after the Ti(O)N layer 11 has been exposed in the open space, the etching gas is switched to $Cl_2$, and the Tl(O)N layer 11 is etched with $Cl_2$ plasma. In this etching, the Ti(O)N layer 11 is etched in the low-density pattern region, while the remaining $WSi_2$ layer 12 in the high-density pattern region is over-etched.

FIG. 3A shows the state when the Tl(O)N layer 11 in the open space of the low-density pattern region is just etched. In the figure, the $WSi_2$ layer 12 in the gap area in the high-density pattern region still remains, but this is not limitative. At this stage, the $WSi_2$ layer 12 may be just etched in the high density pattern region, or the etching of the $WSi_2$ layer 12 has finished, and the etching of the Ti(O)N layer 11 may partially proceed.

Due to the micro-loading effect, etching rate in the high-density pattern region is lower than that in the low-density pattern region. Therefore, at the point at which the etching of the Ti(O)N layer 11 in the low-density pattern region has just finished, at least part of the Ti(O)N layer 11 in the high-density pattern region still remains.

Figure 3B:
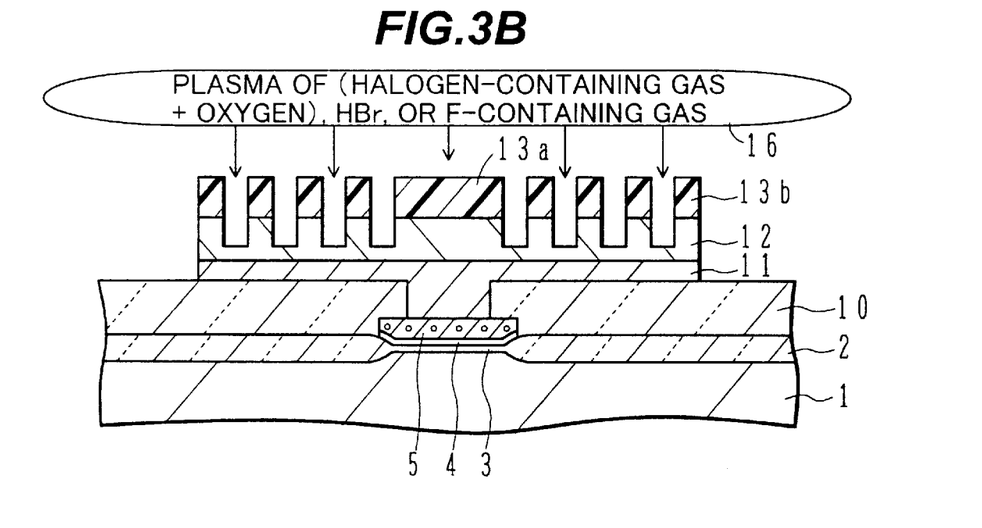

As shown in FIG. 3B, the evaluation of electron shading damage by the plasma to be inspected is performed in this state. First, plasma 16 is generated by the use of an HBr gas only, or a mixed gas of a halogen-containing gas and oxygen, such as $Cl_2/O_2$, $HBr/O_2$ or the like, or a fluorine-containing gas. The plasma 16 of any of those gases does not substantially etch the Ti(O)N layer. Therefore, even after the plasma treatment is effected for a desired period of time, the Ti(O)N layer 11 in the high-density pattern region still remains substantially as it was. The plasma treatment is effected for a desired period of dime to let electron shading effect proceed, and to obtain, a sufficient change of the flat band voltage.

Figure 3C:
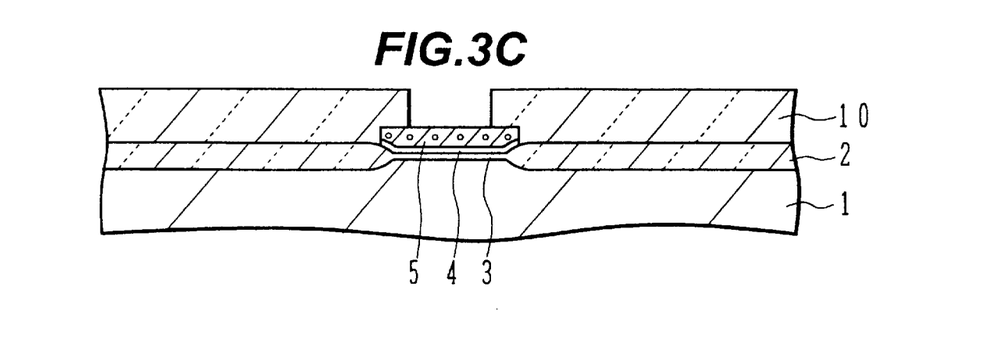

After the plasma treatment, the Ti(O)N layer 11 still remaining in the high-density pattern region is wet-etched with H₂SO₄/H₂O₂. This is isotropic wet-etching, by which even the Ti(O)N layer 11 below the resist pattern 13 is side-etched, and, after all, the Ti(O)N layer 11 is completely etched. At the same time, the WSi₂ layer 12, and the resist patterns 13a, 13b having existed on the Ti(O)N layer 11, are also removed. FIG. 3C shows the completely-etched condition of the sample. During the wet etching, no charges are injected into the gate electrode 5 to cause flat band voltage change.

As the case may be, the wet etching may be finished in the condition in which the antenna layer 11 and 12 above the gate electrode 5 is electrically isolated from the peripheral loop patterns. In this case, however, the antenna layer 11 and 12 above the gate electrode 5 forms some parasitic capacitance, by which the measurement accuracy may be lowered somewhat.

In the condition as illustrated above, the flat band voltage of the MNOS capacitor is measured according to the CV method. Even though the antenna layer 11a and 12a connected with the gate electrode 5 still remains, the antenna layer above the gate electrode 5 is electrically isolated from the peripheral antenna layer 11b and 12b. Even in this condition, therefore, accurate flat band voltage measurement is possible.

Comparing the flat band voltage before the plasma treatment and that after the plasma treatment gives the flat band (that is to say, it is made of a material capable of being chemically etched).

The plasma to be inspected in the process should be such one that the etching rate for the capacitor structure having the transient antenna as in FIG. 3A is satisfactorily low.

Under the conditions that satisfy the requirements as above, the antenna layer 11 and 12 can be a single layer. For example, the transient antenna layer 11 and 12 may be a single Ti(O)N layer. Alternatively, it may be a single layer of aluminum or an aluminum alloy. As having a high degree of RIE lag, aluminum (or its alloy) is favorable for the conductive film to form the transient antenna structure as in FIG. 3A Aluminum (or its alloy) is etched at an extremely low etching rate with fluorine-containing gas plasma or oxygen-rich plasma. On the other hand, WSi₂ and W are etched with a Cl₂-based gas, a fluorine-containing gas or the like, but are etched little with HBr/O₂, HBr or the like. Therefore, the transient antenna structure may also be made of a single layer of WSi₂ or W.

Materials capable of forming the single-layered transient antenna structure, and the etching methods for them are shown in the following Table 1.

TABLE 1

| Constituent Materials for Transient Antenna | Plasma for Forming Transient Antenna Structure | Plasma to be Inspected for Electron Shading Damage | Method for Removal of Transient Antenna |
|---|---|---|---|
| Ti(O)N | Cl₂, CF₄/O₂ | Cl₂/O₂, HBr/O₂, C$_x$H$_y$F$_z$ (fluorocarbons) | H₂SO₄/H₂O₂ solution |
| Al Alloys | Chlorine- or bromine-containing gas | O₂-containing plasma, Fluorine-containing gas plasma | HCl, H₂PO₄, hot H₂SO₄, etc. |
| WSi₂, W | Cl₂-containing gas, Fluorine-containing gas | HBr/O₂, HBr, etc. | Fluorine-containing down-flow plasma (e.g., chemical dry etcher (CDE)) | voltage shift in the sample. The resulting flat band voltage shift is compared with the characteristic curve shown in FIG. 1C, whereby is known the amount of the charges having been injected to the gate-insulating film in the sample processed as above. In this manner, the electron shading damage in the sample is quantified.

In the example illustrated hereinabove, the conductive layer to be etched has a layered structure of a WSi₂ layer and a Ti(O)N layer. Here, any other conductive layer than the WSi₂ layer may be employed. For example, polycrystalline Si, W or the like which is known as a conductor to cause a micro-loading effect may be employed in place of WSi₂. The plasma-processing apparatus is not limited to the inductively coupled plasma etching system used hereinabove. For example, an electron cyclotron resonance (ECR) etching system or the like may also be employed.

For measuring the electron shading effect, a transient antenna structure such as that shown in FIG. 3A should be formed. Here, it is not always necessary that the lower layer 11 and the upper layer 12 constituting the antenna layer are of different materials. The requirements for the entire antenna layer 11 and 12 are that:

(1) it is conductive,
(2) it is made of a material which produces reactive ion etching (RIE) lag, and
(3) it can be removed through etching with a chemical liquid or with non-charged plasma product (radical)

In order to increase the measurement accuracy, it is desirable to increase the charging damage caused by the electron shading effect. In the example illustrated in this embodiment, the plasma treatment, as shown in FIG. 3B, can be effected as long period as desired, whereby the charging damage may be increased to a desired degree. In addition, relative to the area of the MNOS capacitor structure, the antenna area to be exposed in the apertures of the resist pattern can be broadened.

In order to measure only the charging damage caused by the electron shading effect, it is desirable to remove other influences than the electron shading effect as much as possible. For example, if the plasma itself is not uniform, not only the area under the apertures with a high aspect ratio in the resist mask pattern but also the widely exposed area will receive injection of the charge from the plasma. In order to remove this influence, it is desirable to use some reference samples along with the sample for the measurement.

Figure 5A:
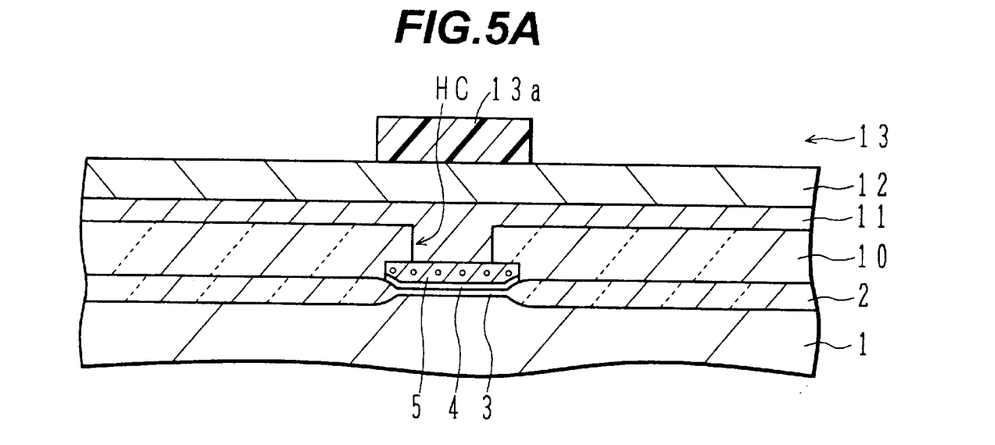
FIG. 5A to FIG. 5C are cross-sectional views and a plan view of a reference sample for the measurement according to the one embodiment of the invention.
Figure 5B:
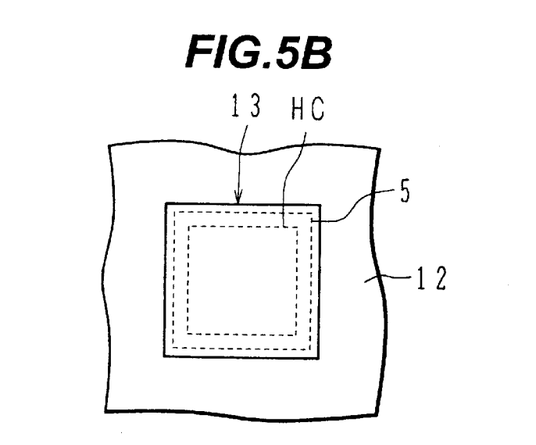
Figure 5C:
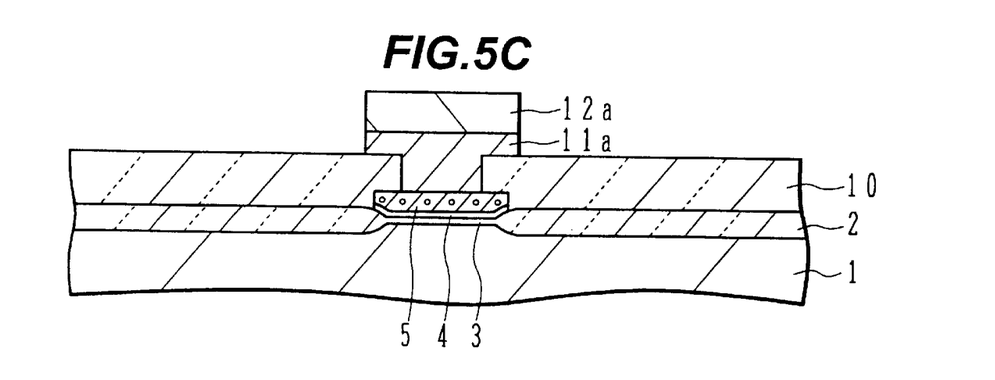

FIG. 5A to FIG. 5C show a structure of reference sample. FIG. 5A and FIG. 5B are a cross-sectional view and a plan view, respectively, of the sample not processed yet.

The structure of the reference sample differs from that of the sample for measurement of FIG. 2A and FIG. 2B only in the profile of the resist mask pattern 13. In the reference sample, the profile of the resist mask pattern 13 is rectangular, and the area thereof is the same as that of the electrode 5. The rectangular resist mask pattern of that type does not substantially bring about an electron shading effect. Therefore, other influences than the electron shading effect, if any, can be measured by the reference sample of FIG. 5A and FIG. 5B. like the sample of FIG. 2A and FIG. 2B, the sample of FIG. 5A and FIG. 5B is treated in the same manner as above and its initial flat band voltage is measured preliminarily. The sample of FIG. 5A and FIG. 5B is processed in the same manner as for the sample of FIG. 2A and FIG. 2B. Thereafter, the resist mask pattern 13 is removed therefrom, to provide a sample shown in FIG. 5C. The flat band voltage of this sample is measured according to the C-V method.

Subtracting the flat band voltage change in the sample of FIG. 5A to FIG. 5C from the flat band voltage change in the sample of FIG. 2A to FIG. 2C and FIG. 3A to FIG. 3C, the flat band voltage shift caused only by the charging damage by the electron shading effect can be obtained.

Description has been made on the case where an electrically isolated antenna layer is formed on the MNOS capacitor. The profile of the antenna pattern to be formed is not limited to the one described above. For example, comb-shaped patterns and others that are widely used for antenna layers in the art can be utilized For the comb-shaped antenna pattern, the MNOS capacitor may be connected with the connection portion of the teeth pattern. In this case, the comb-shaped antenna layer should remain in the processed sample, in the form of being connected with the MNOS capacitor.

The flat band voltage can be measured in this state. In this case, however, the antenna layer forms a capacitance with the substrate etc. to lower the measurement accuracy. In this case, therefore, it is desirable to remove the antenna layer 12 and 11 from the sample after the process shown in FIG. 3B. It is desirable that the antenna layer is removed by wet etching not having any influence on the flat band voltage of the processed sample.

Sample allowing an electrically isolated antenna layer to remain above the MNOS capacitor is advantageous in the point that the flat band voltage can be measured immediately after the step of FIG. 3B.

If the MNOS capacitor structure is isolated from the antenna structure after the etching step, accurate C-V measurement is possible even though the remaining antenna is not removed. For this, it is only required that a loop aperture surrounds the portion just above the MNOS capacitor structure.

If the isolated antenna layer pattern 12a and 11a is within the area of the electrode 5 of the MNOS capacitor structure while the adjacent outer antenna layer pattern 12b and 11b is disposed outside the portion above the electrode 5, accurate C-V measurement is possible even though the antenna layer remains. The profile of the antenna layer in other portions can be selected in a variety of shapes.

Figure 6A:
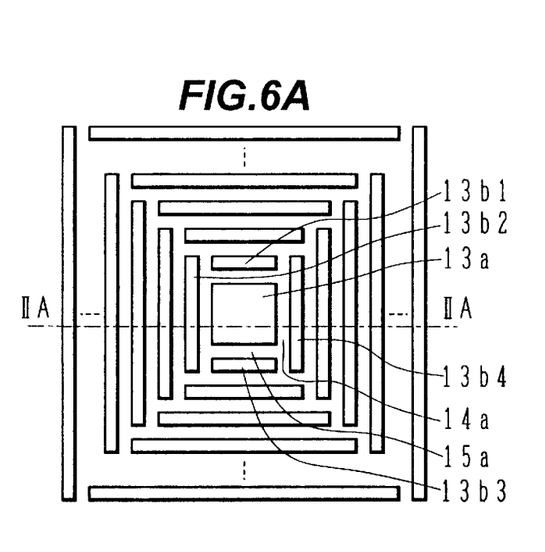
FIG. 6A to FIG. 6D are plan views showing different configurations of the antenna pattern.

FIG. 6A to FIG. 6D show other configurations of the antenna pattern. FIG. 6A is a modification of FIG. 2B. In FIG. 6A, a plurality of rectangular loop apertures of FIG. 2B are connected with the adjacent ones at the corners. The isolated pattern 13a is surrounded by the loop aperture defined by the gap 14a provided in the vertical direction in the drawing and by the gap 15a provided in the horizontal direction. The isolated pattern 13a is isolated from the adjacent linear patterns 13b1 to 13b4. In the example of FIG. 6A, the apertures include the loop aperture formed by the gaps 14a and the gaps 15a, and other loop apertures are connected with this loop aperture.

Figure 6B:
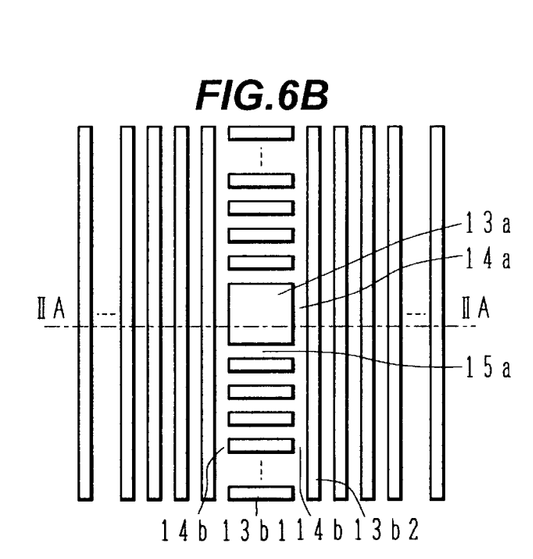

FIG. 6B is another modification of FIG. 2B, wherein a plurality of stripe patterns 13b1 that are parallel to each other in the horizontal direction in the drawing are disposed above and below the isolated pattern 13a which is above the MNOS capacitor structure, and a plurality of stripe patterns 13b2 that are parallel to each other in the vertical direction in the drawing are disposed in the right and left positions besides the isolated pattern 13a. The isolated pattern 13a is surrounded by the loop aperture defined by the gaps 14a provided in the vertical direction in the drawing and the gaps 15a provided in the horizontal direction, and is isolated from the adjacent linear patterns 13b1 that are parallel thereto in the horizontal direction in the drawing and from the linear patterns 13b2 that are parallel thereto in the vertical direction in the drawing.

In the example of FIG. 6B, the apertures include a loop aperture formed by the gaps 14a and the gaps 15a, and the loop aperture is connected with the linear apertures 14b that run in the vertical direction in the drawing. The side profile of the cross section of those constitutions of FIG. 6A and FIG. 6B, along the dotted line IIA—IIA,is the same as that in FIG. 2A.

Figure 6C:
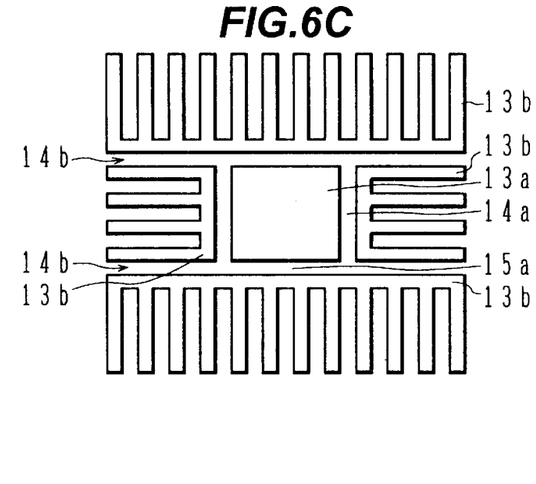

In the example of FIG. 6C, an isolated pattern 13a having nearly the same top profile as that of the MNOS capacitor structure is provided above the MNOS capacitor structure, and comb-shaped antenna patterns 13b are provided in the other portions in such a manner that they surround the isolated pattern 13a. In this example, the isolated pattern 13a is surrounded by a loop aperture defined by the gaps 14a provided in the vertical direction in the drawing and the gaps 15aprovided in the horizontal direction therein, and is isolated from the adjacent comb-shaped antenna patterns 13b.

In the example of FIG. 6C, the apertures include a loop aperture formed by the gaps 14a and the gaps 15a, and the loop aperture is connected with the linear apertures 14b that run in the horizontal direction in the drawing. After the etching of the apertures has finished, the isolated pattern 13a at the center is isolated from other patterns 13b around it.

Figure 6D:
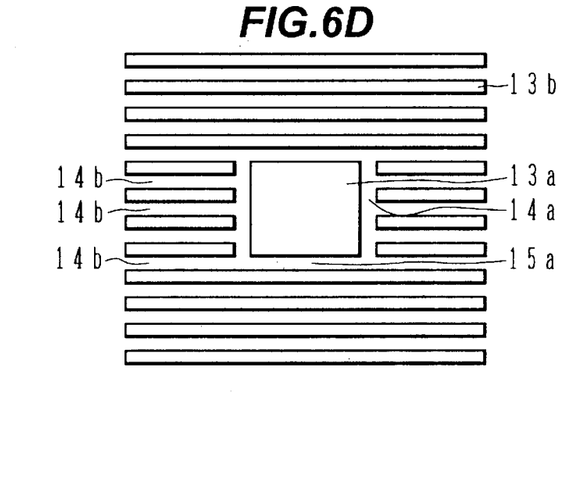

In the example of FIG. 6D, an isolated pattern 13a having nearly the same top profile as that of the MNOS capacitor structure is provided above the MNOS capacitor structure, and stripe patterns 13b that are parallel to each other in the horizontal direction in the drawing are provided in the region around the isolated pattern 13a. In this example, the isolated pattern 13a is surrounded by the loop aperture defined by the gaps 14a provided in the vertical direction in the drawing and the gaps 15a provided in the horizontal direction, and is isolated from the adjacent linear patterns 13b that are parallel to each other in the horizontal direction in the drawing.

In the example of FIG. 6D, the apertures include a loop aperture formed by the gaps 14a and the gaps 15a. The loop aperture is connected with the linear apertures 14b that run in the horizontal direction in the drawing. Around the isolated pattern 13a, a loop aperture is formed.

As described above, the profile of the antenna pattern is not limited to only ring-shaped ones. It is only required that dense patterns are so disposed around the electrode just above the capacitor that they are spaced from each other via sufficiently narrow spaces therebetween to cause the RIE lag by the micro-loading effect.

The invention has been described hereinabove along the embodiments, but the invention is not limited thereto. It will be obvious to those skilled in the art that various modifications, changes, improvements, combinations, etc. are possible.

What is claimed is:

1. A method for measuring electron shading damage in semiconductor fabrication, which comprising:

a step of forcedly flowing a current through a first capacitor structure including a lamination of conductive layer/nitride film/oxide film formed on a semiconductor substrate, and preparing characteristic curve indicating change in flat band voltage relative to amount of injected charge;

a step of preparing a second capacitor structure including a lamination of conductive layer/nitride film/oxide film formed on a semiconductor substrate;

a step of forming an insulating layer on the semiconductor substrate, the insulating layer having an aperture on the second capacitor structure, forming thereon a conductive antenna layer that comprises a lower layer of TiN or TiON and an upper layer of a conductor and is connected with the conductive layer via the aperture, and further forming thereon an insulating mask pattern including a low-density pattern region and a high-density pattern region to thereby prepare a sample;

a first etching step of dry-etching the conductive antenna layer with first plasma to completely remove the antenna layer in the low-density pattern region;

a step, following the first etching step, for plasma-processing the substrate with plasma of any of a mixed gas of a halogen-containing gas and oxygen, HBr, and a fluorine-containing gas;

a second etching step of wet-etching at least the lower layer of TiN or TiON of the conductive antenna layer that remains in the high-density pattern region;

a step of measuring the flat band voltage of the second capacitor structure before and after the plasma-processing step to thereby determine a change thereof; and a step of calculating amount of charges having been injected into the second capacitor structure through the plasma-processing, from the change of the flat band voltage, based on said characteristic curve.

2. The method for measuring electron shading damage as claimed in claim 1, wherein the conductor for said upper layer is $WSi_2$, W or polycrystalline silicon.

3. The method for measuring electron shading damage as claimed in claim 1, wherein the isolated pattern of said antenna layer is used as an electrode for measurement of the flat band voltage after said plasma processing.

4. The method for measuring electron shading damage as claimed in claim 1, wherein the measurement of the flat band voltage before said plasma processing is effected before the formation of said antenna layer.

5. The method for measuring electron shading damage as claimed in claim 1, further comprising the step of annealing said second capacitor structure prior to the flat band voltage measurement before said plasma processing.

6. The method for measuring electron shading damage as claimed in claim 1, wherein said preparing step prepares also a third capacitor structure, said step of forming an insulating layer includes forming a continuous pattern and no gap on the third capacitor structure, and said flat band voltage change is obtained by subtracting the flat band voltage change in the third capacitor structure from the flat band voltage change in the second capacitor structure.

7. A method for measuring electron shading damage in semiconductor fabrication, comprising:

a step of forcedly applying a current to a first capacitor structure of conductive layer/nitride film/oxide film layered on a semiconductor substrate to thereby prepare a characteristic curve indicating flat band voltage change relative to amount of injected charge;

a step of preparing a second capacitor structure of conductive layer/nitride film/oxide film layered on a semiconductor substrate;

a step of forming an insulating layer on the semiconductor substrate, with an aperture on said second capacitor structure, then forming thereon a conductive antenna layer of a single conductive material, which is connected with said conductive layer via said aperture, and forming thereon an insulating mask pattern including a low-density pattern region and a high-density pattern region to prepare a sample;

a first etching step of dry-etching with first plasma to completely remove the antenna layer from the low-density pattern region;

a step following the first etching step, for plasma-processing with plasma of a mixed gas of a halogen-containing gas and oxygen, or HBr, or a fluorine-containing gas;

a second etching step of wet-etching the conductive antenna layer that remains in the high-density pattern region;

a step of measuring flat band voltage of said second capacitor structure before and after said plasma-processing step to obtain a change; and a step of calculating amount of charge having been injected into said second capacitor structure through said plasma processing, from the change in the flat band voltage, based on said characteristic curve prepared previously.

8. The method for measuring of electron shading damage as claimed in claim 7, wherein the conductive material for said antenna layer is $WSi_2$, W or polycrystalline silicon.

9. The method for measuring electron shading damage as claimed in claim 7, wherein the isolated pattern of said antenna layer is used as an electrode for measurement of the flat band voltage after said plasma processing.

10. The method for measuring electron shading damage as claimed in claim 7, wherein the measurement of the flat band voltage before said plasma processing is effected before the formation of said antenna layer.

11. The method for measuring electron shading damage as claimed in claim 7, further comprising the step of annealing said second capacitor structure prior to the flat band voltage measurement before said plasma processing.

12. The method for measuring electron shading damage as claimed in claim 7, wherein said preparing step prepares also a third capacitor structure, said step of forming an insulating layer includes forming a continuous pattern and no gap on the third capacitor structure, and said flat band voltage change is obtained by subtracting the flat band voltage change in the third capacitor structure from the flat band voltage change in the second capacitor structure.

* * * * *